(12) United States Patent  
Bonser et al.

(10) Patent No.: US 8,525,234 B2
(45) Date of Patent: Sep. 3, 2013

(54) FORMATION OF FINFET GATE SPACER

(75) Inventors: Douglas Bonser, Hopewell Junction, NY (US); Catherine B. Labelle, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/419,508

(22) Filed: Mar. 14, 2012

(65) Prior Publication Data

US 2012/0168833 A1    Jul. 5, 2012

Related U.S. Application Data

(62) Division of application No. 12/707,291, filed on Feb. 17, 2010, now Pat. No. 8,174,055.

(51) Int. Cl.
*H01L 29/76* (2006.01)

(52) U.S. Cl.
USPC ............... 257/213; 257/347; 257/E21.421; 257/E29.264; 438/149; 438/151; 438/157; 438/283

(58) Field of Classification Search
USPC .......... 257/213, 347, E21.421, E29.264, 257/E29.127, E21.158, 288, E29.255; 438/149, 438/151, 157, 283, 584, 588
See application file for complete search history.

(56) References Cited

U.S. PATENT DOCUMENTS

| 5,498,882 | A |   | 3/1996  | Houston |
|---|---|---|---|---|
| 5,780,327 | A | * | 7/1998  | Chu et al. ...................... 438/156 |
| 6,284,561 | B1 | * | 9/2001  | Hung ............................... 438/98 |
| 6,750,487 | B2 | * | 6/2004  | Fried et al. ..................... 257/270 |
| 6,969,659 | B1 | * | 11/2005 | Anderson et al. ............. 438/281 |
| 7,179,692 | B2 |   | 2/2007  | Yu et al. |
| 7,259,420 | B2 |   | 8/2007  | Anderson et al. |
| 7,312,126 | B2 | * | 12/2007 | Ilicali et al. ................... 438/283 |
| 7,569,897 | B2 | * | 8/2009  | Anderson et al. ............. 257/386 |
| 7,718,489 | B2 |   | 5/2010  | Anderson et al. |
| 7,759,179 | B2 | * | 7/2010  | Anderson et al. ............. 438/154 |
| 7,923,314 | B2 |   | 4/2011  | Tezuka et al. |
| 7,982,269 | B2 |   | 7/2011  | Anderson et al. |
| 7,989,854 | B2 | * | 8/2011  | Oh et al. ......................... 257/288 |
| 8,227,867 | B2 | * | 7/2012  | Anderson et al. ............. 257/349 |
| 2002/0197810 | A1 | * | 12/2002 | Hanafi et al. .................. 438/330 |
| 2003/0178670 | A1 |   | 9/2003  | Fried et al. |
| 2004/0036118 | A1 | * | 2/2004  | Abadeer et al. ............... 257/347 |
| 2004/0036126 | A1 |   | 2/2004  | Chau et al. |
| 2004/0169239 | A1 | * | 9/2004  | Rim ................................ 257/411 |
| 2005/0101069 | A1 |   | 5/2005  | Mathew et al. |
| 2005/0121676 | A1 | * | 6/2005  | Fried et al. ...................... 257/72 |
| 2006/0022253 | A1 |   | 2/2006  | Anderson et al. |

(Continued)

*Primary Examiner* — N Drew Richards
*Assistant Examiner* — Ankush Singal
(74) *Attorney, Agent, or Firm* — Ditthavong Mori & Steiner, P.C.

(57) ABSTRACT

Gate spacers are formed in FinFETS having a bottom portion of a first material extending to the height of the fins, and a top portion of a second material extending above the fins. An embodiment includes forming a fin structure on a substrate, the fin structure having a height and having a top surface and side surfaces, forming a gate substantially perpendicular to the fin structure over a portion of the top and side surfaces, for example over a center portion, forming a planarizing layer over the gate, the fin structure, and the substrate, removing the planarizing layer from the substrate, gate, and fin structure down to the height of the fin structure, and forming spacers on the fin structure and on the planarizing layer, adjacent the gate.

20 Claims, 3 Drawing Sheets

(56) References Cited

U.S. PATENT DOCUMENTS

| | | | |
|---|---|---|---|
| 2006/0022268 A1 | 2/2006 | Oh et al. | |
| 2006/0154423 A1 | 7/2006 | Fried et al. | |
| 2006/0220131 A1 | 10/2006 | Kinoshita et al. | |
| 2006/0292765 A1 | 12/2006 | Blanchard et al. | |
| 2007/0045736 A1* | 3/2007 | Yagishita | 257/347 |
| 2007/0108537 A1* | 5/2007 | Anderson et al. | 257/401 |
| 2008/0001187 A1* | 1/2008 | Booth et al. | 257/288 |
| 2008/0054374 A1 | 3/2008 | Mikasa | |
| 2008/0087968 A1* | 4/2008 | Nowak | 257/401 |
| 2008/0090361 A1* | 4/2008 | Anderson et al. | 438/283 |
| 2008/0217694 A1 | 9/2008 | Anderson et al. | |
| 2008/0224213 A1 | 9/2008 | Dyer et al. | |
| 2009/0134463 A1* | 5/2009 | Abadeer et al. | 257/365 |
| 2009/0206406 A1* | 8/2009 | Rachmady et al. | 257/365 |
| 2009/0212366 A1* | 8/2009 | Chang et al. | 257/347 |
| 2009/0294800 A1 | 12/2009 | Cheng et al. | |
| 2009/0302402 A1* | 12/2009 | Anderson et al. | 257/411 |
| 2010/0041198 A1 | 2/2010 | Zhu et al. | |
| 2010/0044758 A1 | 2/2010 | Cohen et al. | |
| 2010/0207179 A1* | 8/2010 | Booth et al. | 257/296 |
| 2010/0308381 A1* | 12/2010 | Luning et al. | 257/288 |
| 2011/0037104 A1 | 2/2011 | Anderson et al. | |
| 2011/0042744 A1 | 2/2011 | Cheng et al. | |
| 2011/0084336 A1* | 4/2011 | Luning et al. | 257/347 |
| 2011/0101455 A1* | 5/2011 | Basker et al. | 257/347 |

* cited by examiner

US 8,525,234 B2

FORMATION OF FINFET GATE SPACER

CROSS-REFERENCE TO RELATED APPLICATION

The present application is a divisional application of U.S. application Ser. No. 12/707,291, filed on Feb. 17, 2010, the entire contents of which are herein incorporated by reference.

TECHNICAL FIELD

The present disclosure relates to the formation of Fin Field Effect Transistors (FinFETs). The present disclosure is particularly applicable to formation of gate spacers on FinFETs.

BACKGROUND

The escalating requirements for high density and performance associated with ultra large scale integration semiconductor devices require design features, such as gate lengths below 100 nanometer (nm), high reliability and increased manufacturing throughput. When the gate length of a conventional planar metal oxide semiconductor field effect transistor (MOSFET) is scaled below 100 nm, problems associated with short channel effects, such as excessive leakage between the source and drain, become increasingly difficult to overcome. In addition, mobility degradation and process issues make scaling down device features of conventional MOSFETs difficult. The FinFET design relies upon a thin vertical silicon "fin" to help control current leakage through the transistor in the "off" stage and a double gate structure to control short channel effects.

FIGS. 1A and 1B illustrate top views of a typical FinFET. As shown, gate 101 is wrapped around the top and sides of fin 103. Source 105 is formed at one end of fin 103, and drain 107 is formed at the other end. Gate spacers (not shown) are formed all around the gate. However, spacer formation on FinFETs is difficult, since the spacer must be completely removed from the fin while remaining on the gate. Forming a conformal layer over the gate and fins and etching it back to form spacers leaves material in the lower area and/or damages the spacers. Attempts to optimize the etching of the spacers have not proven successful.

A need therefore exists for methodology to facilitate fabrication of gate spacers on FinFETs employing conventional etching techniques.

SUMMARY

An aspect of the present disclosure is a semiconductor including gate spacers having top and bottom portions, with the bottom portions being the same height as the fins of the gate.

Another aspect of the present disclosure is a method, of fabricating a semiconductor including forming a planarizing layer to the height of the gate fins prior to forming gate spacers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor, the method comprising: forming a fin structure on a substrate, the fin structure having a height and having a top surface and side surfaces; forming a gate perpendicular to the fin structure over a portion of the top and side surfaces, for example over a center portion; forming a planarizing layer over the gate, the fin structure, and the substrate; removing the planarizing layer from the substrate, gate, and fin structure down to the height of the fin structure; and forming spacers on the fin structure and the planarizing layer, adjacent the gate.

Aspects of the present disclosure include removing the planarizing layer by etching. Further aspects include forming the spacers by depositing a conformal layer over the gate, the fin structure, and the planarizing layer, and etching the conformal layer. Other aspects include forming the planarizing layer of spin-on-glass or a spin-on dielectric. Another aspect includes removing the remaining planarizing layer using the spacers as a mask, for example by etching. Additional aspects include forming a first layer, planarizing by chemical mechanical polishing (CMP), and then etching back before depositing the conformal layer. Other aspects include depositing the conformal layer by chemical vapor deposition. Another aspect includes forming the conformal layer of a suitable conformal material, such as an oxide or a nitride. Further aspects include a degree of etch selectivity between the planarizing layer and the conformal layer being greater than or equal to about 3 to 1. Additional aspects include depositing the conformal layer to a thickness of about 5 nm to about 80 nm.

Another aspect of the present disclosure is a semiconductor device comprising: a fin structure on a substrate, the fin structure having a height and having top and side surfaces; a gate formed perpendicular to the fin structure over a portion of the top and side surfaces, for example over a center portion; and first and second spacers adjacent the gate, the first spacers being formed on the fin structure and the second spacers being formed on the substrate wherein: the first spacers are formed of a first material; and the second spacers comprise a first portion having a height the same as the fin structure and a second portion on top of the first portion, the first portion being formed of a second material and the second portion being formed of the first material.

Aspects include a semiconductor device wherein the first portion of the second spacers is formed by depositing a planarizing layer over the gate, fin structure, and substrate and etching to the height of the fin structure. Further aspects include a semiconductor device wherein the planarizing layer comprises spin-on-glass or a spin-on dielectric. Another aspect includes a semiconductor device wherein the first spacers and the second portion of the second spacers are formed simultaneously. Additional aspects include a semiconductor device wherein the first spacers and the second portion of the second spacers are formed by depositing a conformal layer over the gate, the fin structure, and the planarizing layer and etching the conformal layer. Other aspects include a semiconductor device wherein the conformal layer comprises a suitable conformal material, such as an oxide or a nitride. Further aspects include a semiconductor device wherein a degree of selectivity between the planarizing layer and the conformal layer is greater than or equal to about 3 to 1. Another aspect includes a semiconductor device wherein the conformal layer is deposited to a thickness of about 5 nm to about 80 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 7A schematically illustrate a first view of sequential steps of a method in accordance with an exemplary embodiment; and FIGS. 2B through 7B schematically illustrate a second view of sequential steps of a method in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the etching problem attendant upon forming gate spacers on FinFETs. In accordance with embodiments of the present disclosure, a first or planarizing layer is etched to the same height as the fins to level the base of the spacers around the gate. Consequently, the spacers may be etched the same amount or to the same height all around the gate, and conventional spacer etch techniques may be employed.

Methodology in accordance with embodiments of the present disclosure includes forming a FinFET, forming a planarizing layer over the gate, the fin structure, and the substrate, removing the planarizing layer from the substrate, gate, and fin structure down to the height of the fin structure, and forming spacers on the fin structure and the planarizing layer, adjacent the gate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 7A illustrate sequential steps of a method in accordance with an exemplary embodiment, as viewed perpendicular to the gate. FIGS. 2B through 7B illustrate the same steps as viewed parallel to the gate. Adverting to FIGS. 2A and 2B, gate 201 is shown with fin 203. As illustrated in FIG. 2B, gate 201 is formed around the top and sides of fin 203.

Figure 1A:
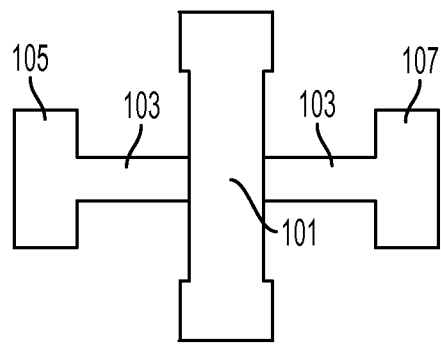
FIGS. 1A and 1B schematically illustrate top views of a conventional FinFET.
Figure 1B:
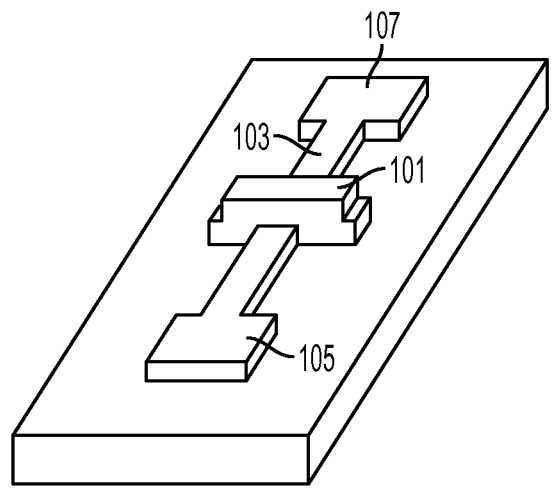
Figure 2A:
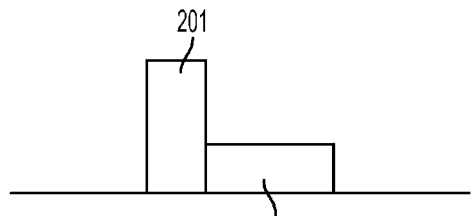
Figure 2B:
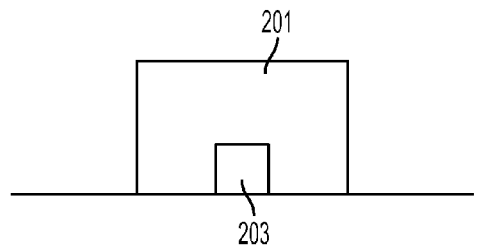
Figure 3A:
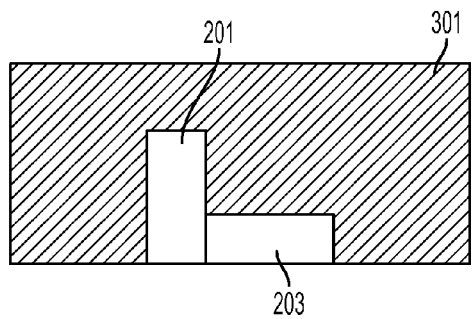
Figure 3B:
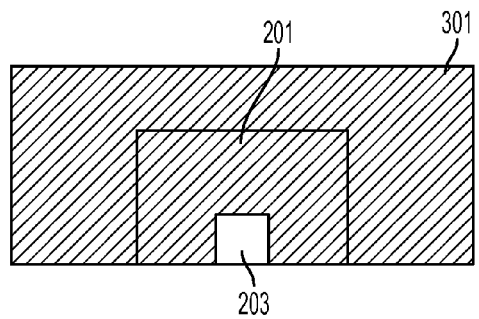

In FIGS. 3A and 3B, a first or planarizing layer 301 is deposited over gate 201 and fin 203. Planarizing layer 301 may be formed, for example, of spin-on-glass or spin-on dielectric, to a thickness about the height of gate 201, e.g., about 30 nm to about 100 nm. Planarizing layer 301 may alternatively be formed of a material that is not planarizing, for example an oxide, by depositing the material to a thickness great enough to exceed the height of gate 201 and performing chemical mechanical polishing (CMP) to planarize the material down to the height of gate 201.

Figure 4A:
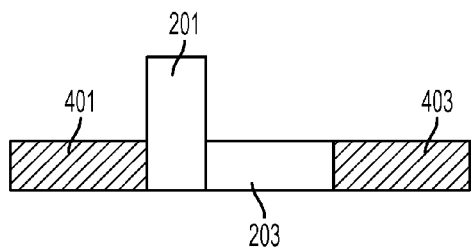
Figure 4B:
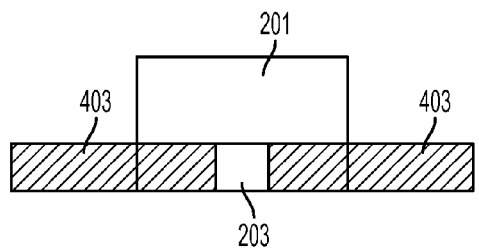

Planarizing layer 301 is then etched back to the height of fins 203, for example, about 10 nm to about 60 nm, thereby forming elements 401 (adjacent gate 201) and 403 (adjacent fin 203) (see FIGS. 4A and 4B).

Figure 5A:
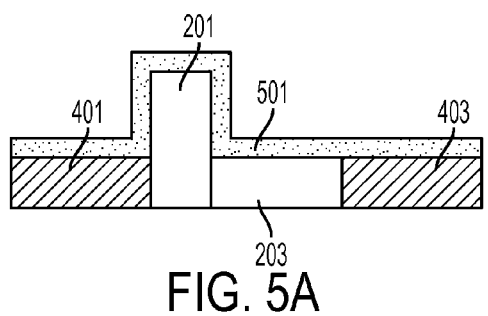
Figure 5B:
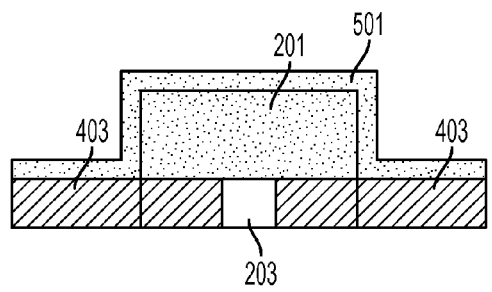

Adverting to FIGS. 5A and 5B, a conformal layer 501 is deposited, e.g., by chemical vapor deposition, over gate 201, fins 203, and elements 401 and 403. Conformal layer 501 may be formed of any suitable conformal material, such as an oxide or nitride, to a thickness of about 5 nm to about 80 nm. The degree of etch selectivity between planarizing layer 301 and conformal layer 501 may be greater than or equal to about 3 to 1.

Figure 6A:
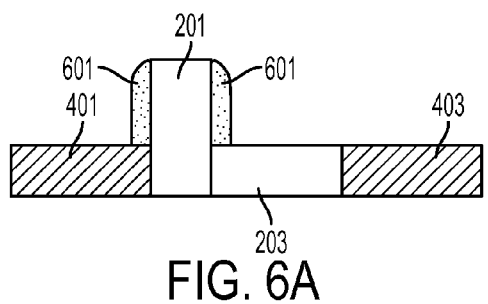
Figure 6B:
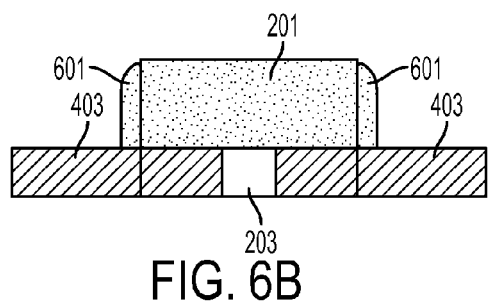
Figure 7A:
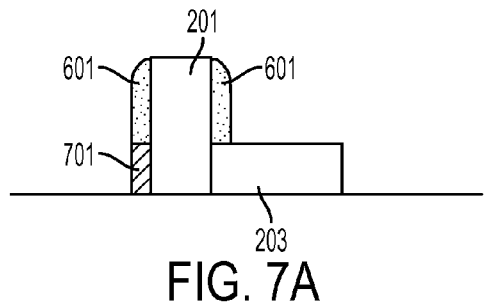
Figure 7B:
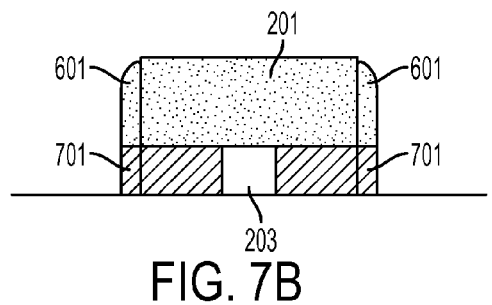

As illustrated in FIGS. 6A and 6B, gate spacers 601 are then etched all around gate 201. Conventional etching techniques may be employed for etching spacers 601, since the base of the spacers is uniform, i.e., the height of fins 203, all around gate 201. After formation of spacers 601, elements 401 are etched off. At the same time, elements 403 are etched straight down from spacers 601, as shown in FIGS. 7A and 7B, forming a bottom portion 701 for gate spacers not on fin 203. Because of the etch selectivity between planarizing layer 301 and conformal layer 501, etching elements 401 and 403 does not damage spacers 601.

The embodiments of the present disclosure can achieve several technical effects, including formation of gate spacers in FinFETS using conventional etching techniques. The present disclosure enjoys industrial applicability in any of various types of highly integrated semiconductor devices employing FinFETs.

In the preceding description, the present disclosure is described with reference to specifically exemplary embodiments thereof It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A semiconductor device comprising:
   a fin structure on a substrate, the fin structure having a height and having top and side surfaces;
   a gate formed perpendicular to the fin structure over a portion of the top and side surfaces; and
   first and second spacers adjacent the gate, the first spacers being formed on the fin structure and the second spacers being formed on the substrate wherein:
   the first spacers are formed of a first material; and
   the second spacers comprise a first portion having a height the same as the fin structure and a second portion on top of and in contact with the first portion, the first portion being formed of a second material, different than the first material, and the second portion being formed of the first material.

2. The semiconductor device according to claim 1, wherein the first portion of the second spacers is formed by depositing a planarizing layer over the gate, fin structure, and substrate and etching to the height of the fin structure.

3. The semiconductor device according to claim 1, wherein the height of the fin structure is 10 nm to 60 nm.

4. The semiconductor device according to claim 1, wherein the second material comprises an oxide.

5. The semiconductor device according to claim 2, wherein the planarizing layer comprises spin-on-glass or a spin-on dielectric.

6. The semiconductor device according to claim 2, wherein the first spacers and the second portion of the second spacers are formed simultaneously.

7. The semiconductor device according to claim 6, wherein the first spacers and the second portion of the second spacers are formed by depositing a conformal layer over the gate, the fin structure, and the planarizing layer and etching the conformal layer.

8. The semiconductor device according to claim 7, wherein the conformal layer comprises an oxide or a nitride.

9. The semiconductor device according to claim 7, wherein a degree of selectivity between the planarizing layer and the conformal layer is greater than or equal to about 3 to 1.

10. The semiconductor device according to claim 7, wherein the conformal layer is deposited to a thickness of about 5 nm to about 80 nm.

11. A device comprising:
a fin structure on a substrate, the fin structure having a first height and having top and side surfaces;
a gate formed perpendicular to the fin structure over a portion of the top and side surfaces; and
first gate spacers formed of a first material on the substrate, adjacent the gate, having the first height;
second gate spacers formed of a second material on the first gate spacers and on the fin structure, adjacent the gate, having a second height, wherein the sum of the first height and the second height equals a height of the gate.

12. The device according to claim 11, wherein the first material comprises spin-on-glass or a spin-on dielectric.

13. The device according to claim 11, wherein the first material comprises an oxide.

14. The device according to claim 11, wherein the first height is 10 nm to 60 nm.

15. The device according to claim 11, wherein the second material comprises an oxide or a nitride.

16. The device according to claim 11, wherein a degree of selectivity between the first material and the second material is greater than or equal to about 3 to 1 for etching.

17. The device according to claim 11, wherein the height of the gate is 30 nm to 100 nm.

18. The device according to claim 11, wherein the first and second gate spacers have a width of 5 nm to 80 nm.

19. A semiconductor device comprising:
a fin structure on a substrate, the fin structure having a first height of 10 nm to 60 nm and having top and side surfaces;
a gate formed perpendicular to the fin structure over a portion of the top and side surfaces, the gate having a bottom portion having a height equal to the first height and a top portion having a second height, wherein a sum of the first height and the second height is 30 nm to 100 nm;
first spacers formed of a first material comprising spin-on-glass or spin-on-dielectric on the substrate adjacent the bottom portion of the gate and having the first height second spacers formed of a second material comprising an oxide or a nitride on the first spacers and on the fin structure adjacent the top portion of the gate and having the second height, wherein
a degree of selectivity between the first material and the second material is greater than or equal to about 3 to 1 for etching.

20. The semiconductor device according to claim 19, wherein the first and second gate spacers have a width of 5 nm to 80 nm.

* * * * *